US006239901B1

(12) United States Patent
Kaneko

(10) Patent No.: US 6,239,901 B1
(45) Date of Patent: May 29, 2001

(54) LIGHT SOURCE UTILIZING A LIGHT EMITTING DEVICE CONSTRUCTED ON THE SURFACE OF A SUBSTRATE AND LIGHT CONVERSION DEVICE THAT INCLUDES A PORTION OF THE SUBSTRATE

(75) Inventor: Yasuhisa Kaneko, Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/285,872

(22) Filed: Apr. 1, 1999

(30) Foreign Application Priority Data

Apr. 3, 1998 (JP) .................................. 10-108761
Apr. 1, 1999 (JP) .................................. 11-95547

(51) Int. Cl.$^7$ .............................. G02F 1/35; H01S 3/109
(52) U.S. Cl. ............................... 359/326; 372/22; 372/50
(58) Field of Search ................... 359/326–332; 372/21, 22, 43, 50; 385/122

(56) References Cited

U.S. PATENT DOCUMENTS

| Re. 35,215 | * | 4/1996 | Waarts et al. ....................... 372/50 X |
| 4,528,464 | * | 7/1985 | Chemla et al. ....................... 359/326 |
| 4,862,473 | * | 8/1989 | Yano et al. .............................. 372/50 |
| 4,951,293 | * | 8/1990 | Yamamoto et al. .................... 372/50 |
| 5,007,694 | * | 4/1991 | Yamamoto et al. .................. 359/326 |
| 5,208,827 | * | 5/1993 | Sagawa et al. .................. 359/328 X |
| 5,379,311 | * | 1/1995 | McFarlane et al. ............... 372/50 X |

OTHER PUBLICATIONS

Moulton, P. F., "Spectroscopic and Laser Characteristics of Ti:Al$_2$O$_3$" Solid State Laser Material, vol. 3, No. 1/Jan. 1986, Journal of the Optical Society of America B, pp. 125–133.

Cronemeyer, D. C., "Optical Absorption Characteristics of Pink Ruby", Journal of the Optical Society of America, vol. 56, No. 12, Dec. 1996, pp. 1703–1706.

Nakamura, Shuji et al., "High–Power, Long–Lifetime InGaN Multi–Quantum–Well–structure Laser Diodes", Japan Journal of Applied Physics, vol. 36, 1997, pp. L1059–L1061, Part 2, No. 8, Aug. 15, 1997.

Nakamura, Shuji et al., "InGaN–Based Multi– Quantum–Well–Structure Laser diodes", Japan Journal of Applied Physics, vol. 35, 1996, pp. L74–76, Part 2, No 1B, Jan. 15, 1996.

Fejer,Martin M., et al., Quasi–Phase–Matched Second Harmonic Generation: Tuning and Tolerances, IEEE Journal of Quantum Electronics, vol. 28, No. 11, Nov. 1992, pp. 2631–2654.

Fan, Tso Yee et al., "Diode Laser–Pumped Solid–State Lasers", IEEE Journal of Quantum Electronics, vol. 24,No. 6, Jun. 1988, pp. 895–912.

* cited by examiner

*Primary Examiner*—John D. Lee

(57) ABSTRACT

A light source constructed from a light emitting device and a light conversion device. The light-emitting device emits light of a first wavelength and includes a semiconductor device on a surface of a substrate. The light conversion device includes a portion of the substrate. The light conversion device receives the light of the first wavelength and emits light of a second wavelength different from the first wavelength. The substrate includes a crystal of a fluorescent material doped with an activator. The light emitting device is preferably a light emitting diode or a laser diode. In one embodiment of the invention, the light emitting device is constructed in a groove in the substrate such that light generated by the light emitting device enters the wall of the groove. Embodiments of the invention for generating second-harmonic light may be constructed by including a waveguide structure in the substrate and alternating polarized regions formed in the substrate perpendicular to the light propagation direction

17 Claims, 13 Drawing Sheets

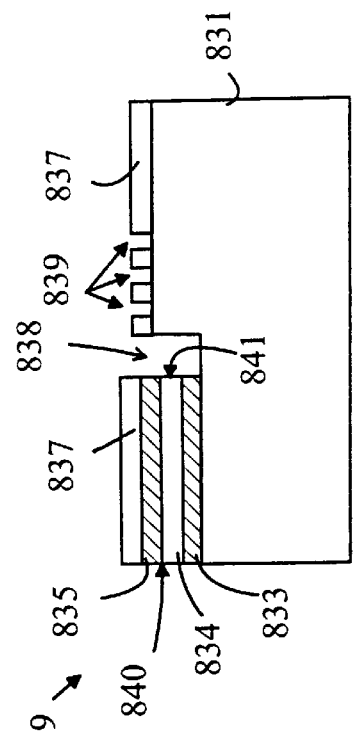
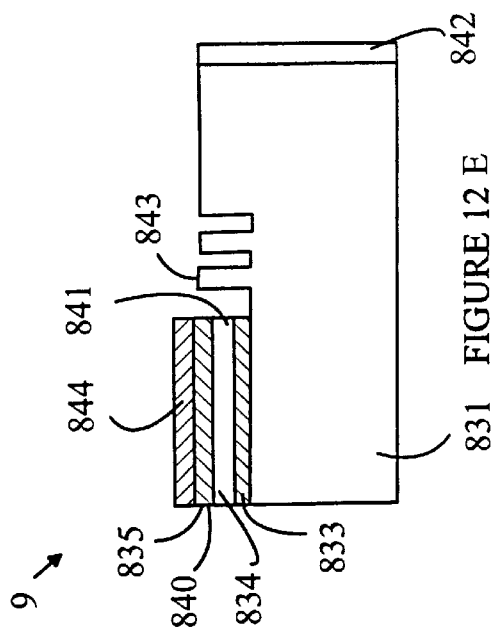
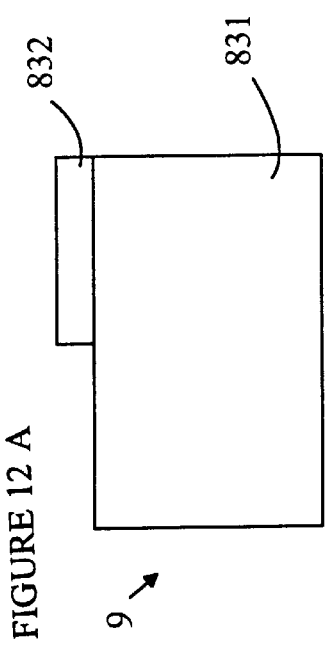
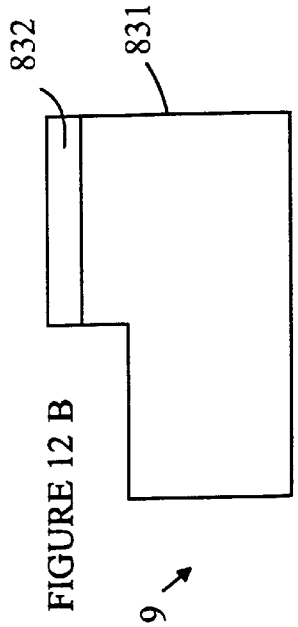
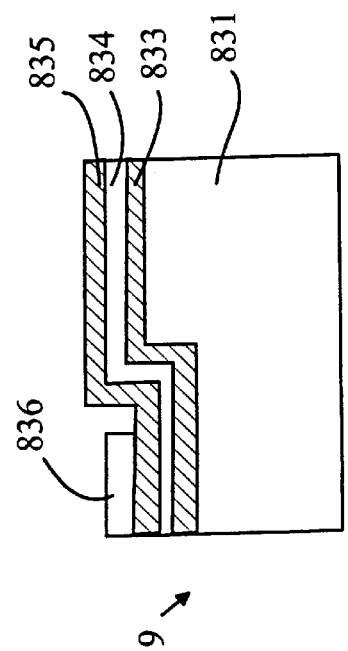

LIGHT SOURCE UTILIZING A LIGHT EMITTING DEVICE CONSTRUCTED ON THE SURFACE OF A SUBSTRATE AND LIGHT CONVERSION DEVICE THAT INCLUDES A PORTION OF THE SUBSTRATE

The present invention relates to lasers, and more particularly, to lasers that are pumped by a light source having a wavelength different from that of the light emitted by the laser.

BACKGROUND OF THE INVENTION

One class of light source based on a solid-state laser consists of a hybrid structure that combines an excitation light source and a solid-state laser. The excitation light source emits light that differs in wavelength from that of the solid state laser. For example, this type of source is utilized to provide wavelength conversions. In addition, by passing the light from the laser light source through a nonlinear optical crystal, devices that generate multiple wavelengths such as the second harmonic of the solid-state laser may be fabricated. Such lasers are described in Introduction to Optical Electronics by Amnon Yariv (third edition, published in 1985, 1976, 1971 by Holt, Rinehart and Winston, Inc.; translated into Japanese by Kunio Tada and Takeshi Kamiya, Nov. 25, 1988, published by Maruzen), and hence, will not be discussed in detail here.

There are a number of problems which add to the cost of constructing such light sources. First, the excitation light source and solid-state laser are fabricated separately. These components must be placed in exact positions relative to one another. This alignment step substantially increases the cost of fabrication. In addition, the resulting device is substantially larger than the solid-state laser. It is advantageous to provide as compact a device as possible.

Second, once aligned, the components must be protected from mechanical vibrations that can alter the alignment of the components. In prior art devices, the components must be mounted on a vibration isolating base. This base further increases the complexity, cost, and size of the final devices, and hence, detracts from the commercial use of such devices.

Broadly, it is the object of the present invention to provide an improved hybrid laser device.

It is a further object of the present invention to provide a light source device in which the excitation source and solid-state laser are fabricated on the same substrate in precise alignment with one another.

These and other objects of the present invention will become apparent to those skilled in the art from the following detailed description of the invention and the accompanying drawings.

SUMMARY OF THE INVENTION

The present invention is a light source constructed from a light emitting device and a light conversion device. The light-emitting device emits light of a first wavelength and includes a semiconductor device on a surface of a substrate. The light conversion device includes a portion of the substrate. The light conversion device receives the light of the first wavelength and emits light of a second wavelength different from the first wavelength. The substrate includes a crystal of a fluorescent material doped with an activator. The light emitting device is preferably a light emitting diode or a laser diode. In one embodiment of the invention, the light emitting device is constructed in a groove in the substrate such that light generated by the light emitting device enters the wall of the groove. Embodiments of the invention for generating second-harmonic light may be constructed by including a waveguide structure in the substrate and alternating polarized regions formed in the substrate perpendicular to the light propagation direction.

BRIEF DESCRIPTION OF THE DRAWINGS

FIGS. 12A–12E are cross-sectional views of a light source according another embodiment of the present invention at various stages in the fabrication process.

DETAILED DESCRIPTION OF THE INVENTION

Figure 1:
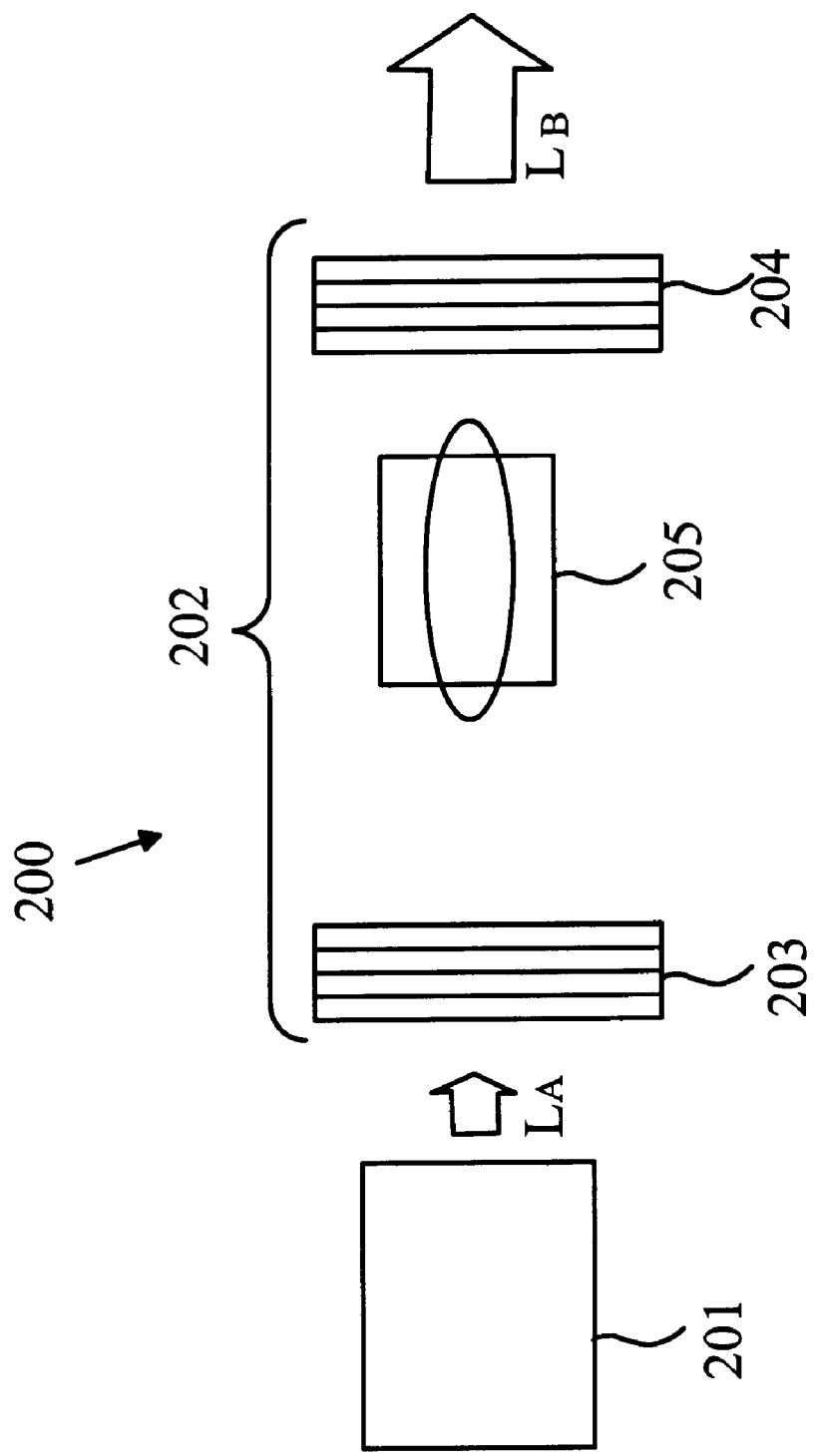
FIG. 1 is a cross-sectional view of a typical prior art light source constructed from a LED and a solid-state laser.

The present invention may be more easily understood with reference to a typical prior art light source shown in FIG. 1 at 200. Source 200 is a hybrid structure that combines an excitation light source 201 and a solid-state laser 202. The excitation light source 201 may be a naturally-emitted light source or a laser light source. The solid-state laser 202 is composed of an input mirror 203, an output mirror 204, and a laser crystal 205. Solid-state laser 202 converts the light generated by source 201 to light at a second wavelength. The light $L_A$ from the excitation light source 201 is injected into the laser crystal 205 where it acts as the pumping source. Laser light $L_B$ is emitted from output mirror 204. The output wavelength $L_B$ of the device is determined by an activator that is typically introduced by doping the laser crystal 205 and by the dimensions of the laser.

In prior art devices, the excitation light source and solid-state laser are constructed separately and then mounted on a common substrate. In the present invention, the excitation light source and solid-state laser are constructed together, and hence, avoid the alignment and cost problems associated with separate construction.

In a light source according to the present invention, the light from a semiconductor light emitter on an optical crystal substrate that transmits the laser light is incident on the substrate and undergoes wavelength conversion prior to being emitted. The light-emitting source can be a light-emitting device (LED) or a semiconductor laser. If the optical crystal substrate is doped with an activator, $Al_2O_3$, GaAs, $BeAl_2O_4$, $MgF_2$, GaAs, InP, and GaP can be used as the substrate. $Cr^{3+}$, $Ti^{3+}$, $Er^{3+}$, $V^{2+}$, $Co^{2+}$, or $Nd^{3+}$ can be used as the activator. The optical crystal substrate may be doped as it is grown. The optical crystal substrate may be uniformly or non-uniformly doped. In addition, a plurality of dopants can be utilized.

Any substrate used to construct conventional solid-state light sources may be utilized. If the optical crystal substrate is composed of $Al_2O_3$ crystal, a structure composed of a III–V nitride semiconductor can be used as the light-emitting source. The $Al_2O_3$ crystal substrate is used as the substrate for growing the III–V nitride semiconductor. The preferred concentration of $Cr^{3+}$ or $Ti^{3+}$ in the $Al_2O_3$ crystal substrate is in the range from $10^{17}$ to $10^{21}$ $cm^{-3}$. If the optical crystal substrate is composed of crystalline GaAs, InP, GaP, or Si, rare earth ions, such as $Er^{3+}$ or $Nd^{3+}$, are adopted as the activators. If the optical crystal substrate is a GaAs crystal, the preferred concentration of rare earth ions in the crystal substrate is in the range from $10^{17}$ to $10^{21}$ $cm^{-3}$.

Embodiments of the present invention in which the substrate includes a non-linear optical crystal for performing wavelength conversion such as second-harmonic-generation may also be constructed. In such embodiments, light is generated by passing light from the light source through the nonlinear optical crystal. $Sr_2Be_2BO_7$ (SBBO), $KTiOPO_4$ (KTP), $LiB_3O_5$ (LBO), $BaB_2O_4$ (BBO), $NH_4H_2PO_4$ (ADP), $LiNbO_3$, or $LiTaO_3$ can be used as the nonlinear optical crystal. A III–V nitride semiconductor can be used as the light emitting element with these crystals.

It should be noted that a light source according to the present invention can be a bottom-emitting or an edge-emitting device, and hence, the present invention may be utilized in a variety of applications, such as optical communication devices and display devices. Furthermore, by utilizing a suitable activator, light with various wavelengths including white light can be generated.

Figure 2:
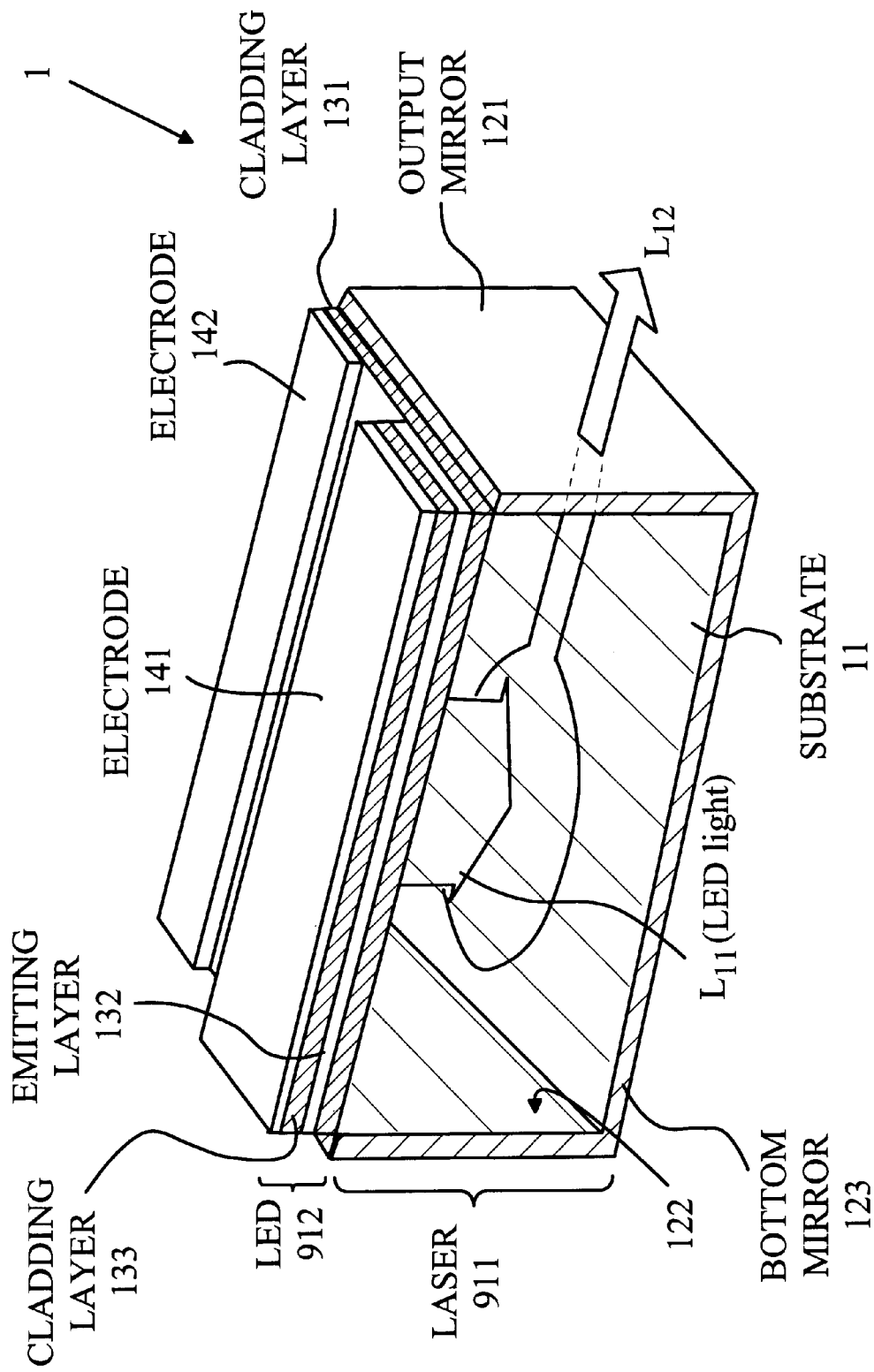
FIG. 2 is a perspective view of one embodiment of an edge-emitting light source according to the present invention.

The manner in which the present invention provides its advantages will now be explained with reference to several embodiments of the present invention. Refer now to FIG. 2, which is a perspective view of an edge-emitting source 1 according to the present invention. Source 1 includes a solid-state laser 911 and a LED emitter 912.

The solid-state laser 911 is formed from an $Al_2O_3$ optical crystal substrate 11 having end face mirrors 121, 122 and bottom mirror 123. In this embodiment, the solid-state laser 911 is a ruby laser. $Cr^{3+}$ is doped with a concentration in the range from $10^{17}$ to $10^{21}$ $cm^{-3}$ in the optical crystal substrate 11. The optical crystal substrate 11 acts as the laser crystal of the solid-state laser as described above. In addition, substrate 11 is used to form LED emitter 912.

LED emitter 912 is formed on the optical crystal substrate 11 and includes an AlGaN cladding layer 131, GaInN light-emitting layer 132, and AlGaN cladding layer 133. Light is generated in LED 912 by passing a current between a first electrode 141 and a second electrode 142. Light-emitting layer 132, cladding layer 133, and electrode 141 are formed over one region of cladding layer 131. The second electrode 142 is formed on part of cladding layer 131 that does not underlie light-emitting layer 132 and cladding layer 133.

For the dopants and crystal composition discussed above, LED 912 generates light $L_{11}$ at a wavelength of 400 nm in the light-emitting layer 132. This light pumps solid-state laser 911 to excite the activator $Cr^{3+}$ in the $Al_2O_3$ laser crystal. $Cr^{3+}$ has an absorption peak near the 400-nm wavelength and has a fluorescent peak near the 690-nm wavelength. Hence, the $Cr^{3+}$ is an efficient activator for providing laser light $L_{12}$ with a 690-nm wavelength which is output from the end mirror 121.

It should be noted that the first and second electrodes act as a top mirror corresponding to bottom mirror 123. These mirrors trap the light generated by LED 912 and thereby increase the efficiency of conversion of the pumping light. The LED described above can generate light at wavelengths from 405 to 550 nm. For example, in a LED that generates light at a wavelength of 405 nm, the maximum output is 12 mW (S. Nakamura et al., Jpn. J. Appl. Phys. Lett. 67 (1995), p. 1868). When the output light is converted into energy density, it can be shown that this device generates 27 $W/cm^2$. In general, the light output of a conventional LED with a structure that emits light to the outside through a transparent electrode is considered to be 30 $W/cm^2$ at most.

The oscillation threshold $P_{th}$ of solid-state laser 911 can be shown to be approximately 66 $W/cm^2$. The threshold power of the ruby laser is substantially lower than that of the titanium sapphire laser described below because of two factors. First, the fluorescence lifetime of the ruby laser is longer than the fluorescence lifetime of the titanium sapphire laser. Second, the wavelength of the excitation light matches the peak absorption of ruby. By utilizing a LED design having the reflecting mirrors described above, this threshold power can be obtained even though the light output of the LED is below this level.

In the embodiment described above, a LED is used as the light emitter formed on the ruby ($Al_2O_3$ optical crystal substrate doped with $Cr^{3+}$) substrate. However, it will be obvious to those skilled in the art from the preceding discussion that a laser can be used in place of the LED.

Figure 3:
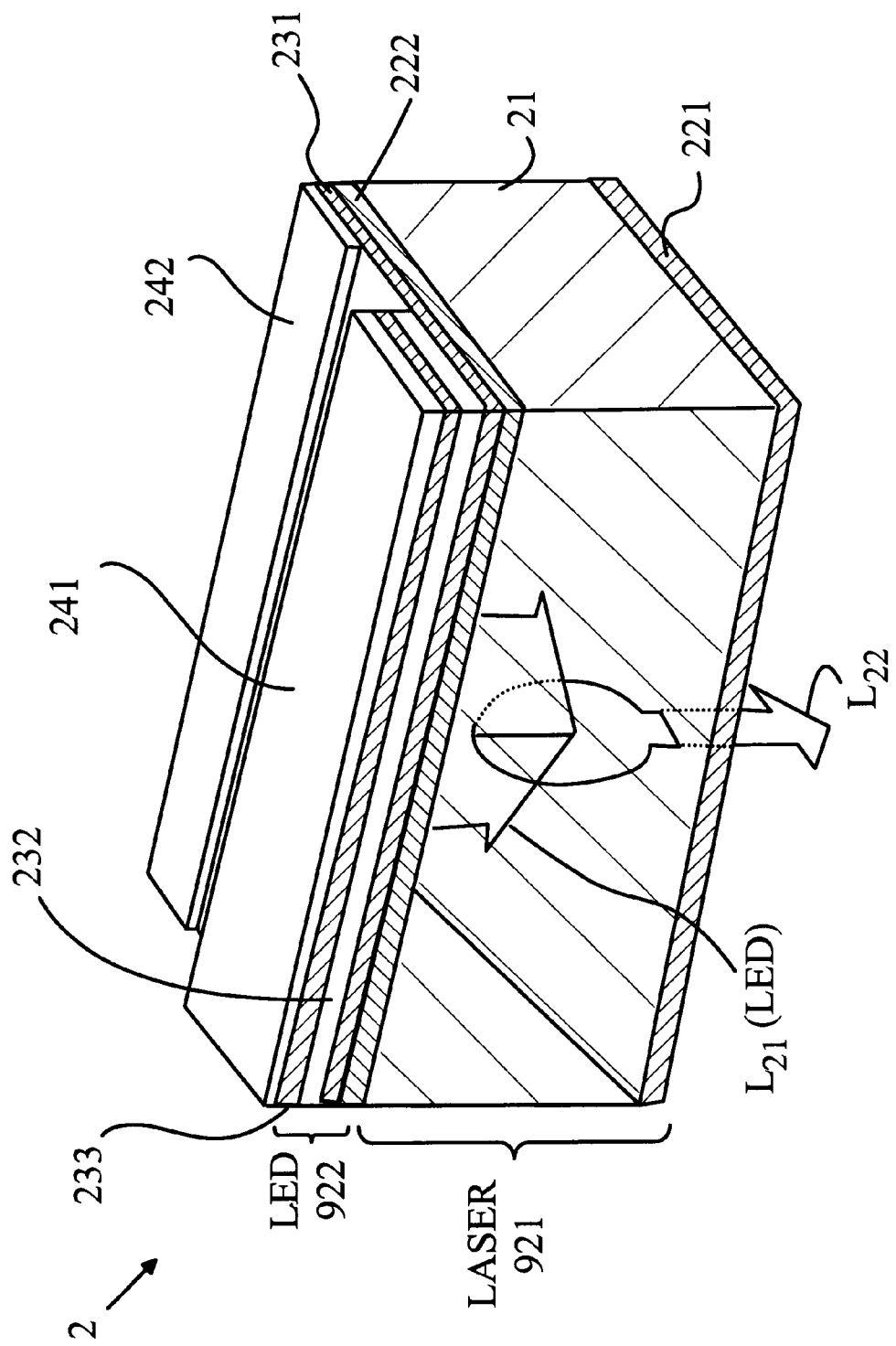
FIG. 3 is a perspective view of one embodiment of a bottom-emitting light source according to the present invention.

The teachings of the present invention can also be utilized in a bottom-emitting solid-state light source. Refer now to FIG. 3 which is a perspective view of a bottom-emitting light source 2. The device is constructed from a solid-state laser 921 and an LED emitter 922 in a manner analogous to that discussed above with reference to light source 1 shown in FIG. 2.

The solid-state laser 921 is formed from the $Al_2O_3$ optical crystal substrate 21 with an input mirror 222 and an output mirror 221 formed on its top and bottom surfaces. In this embodiment, solid-state laser 921 is a ruby laser. The $Al_2O_3$ optical crystal substrate 21 is doped with $Cr^{3+}$ with a concentration in the range from $10^{17}$ to $10^{21}$ $cm^{-3}$. In addition, optical crystal substrate 21 functions as the substrate for forming LED emitter 922.

LED emitter 922 is a light source formed on the mirror 222, and its structure is essentially identical to the LED emitter 912 in embodiment 1. That is, the LED emitter 922 consists of an AlGaN cladding layer 231, a GaInN light-emitting layer 232, and an AlGaN cladding layer 233. A first electrode 241 is formed on cladding layer 233. A second electrode 242 is formed on part of cladding layer 231 that does not underlie light-emitting layer 232 and cladding layer 233. The various electrodes and layers are preferably rectangular in shape.

LED emitter 922 generates the LED light $L_{21}$ with a 400-nm wavelength. The LED light excites the laser crystal ($Al_2O_3$) and excites the activator $Cr^{3+}$. Laser light $L_{22}$ with a 690-nm wavelength is emitted from the output mirror 221.

Figure 4:
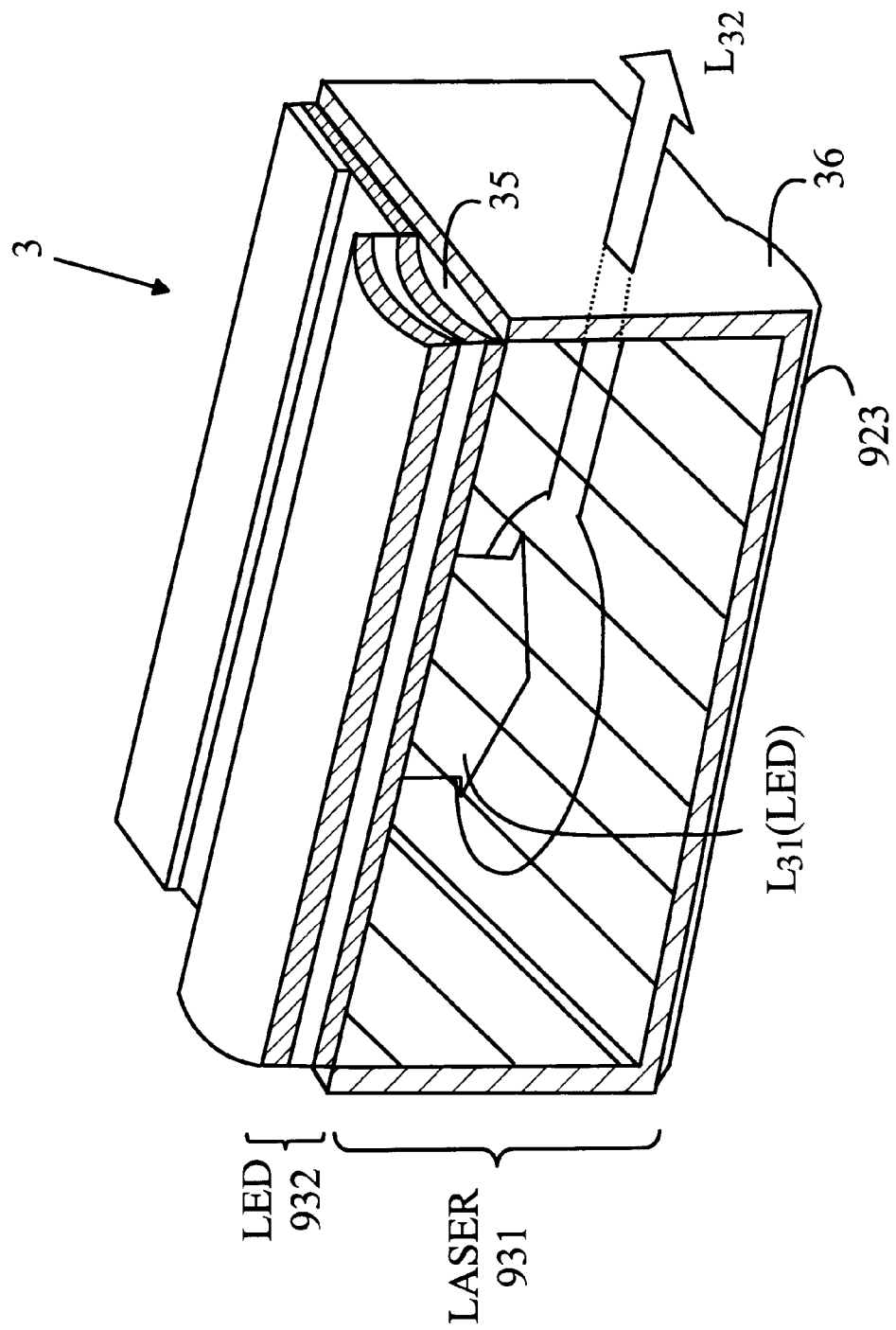
FIG. 4 is a perspective view of another embodiment of an edge-emitting light source according to the present invention.

The light intensity of the pumping source, i.e., LED emitters 912 and 922 shown in FIGS. 2 and 3, can be further increased by incorporating a convex lens between the LED and the solid-state laser. A top perspective view of such an embodiment of the present invention is shown in FIG. 4 at 3. Light source 3 is analogous to light source 1 shown in FIG. 2. Light source 3 is constructed from a LED source 932 and a solid-state laser 931. A convex lens 35 is incorporated in the top surface of the crystal substrate. LED emitter 932 which has the same basic structure as the LED emitter 912 shown in FIG. 2 is formed on convex lens 35. The LED light $L_{31}$, from the LED emitter 932 is focused by convex lens 35 to a line within the crystal substrate and pumps the solid-state laser 931. Laser light $L_{32}$ with a 690-nm wavelength is output from the output mirror of the solid-state laser 931. A corresponding concave reflector 36 may be incorporated in the bottom mirror 923 of solid-state laser 931 to refocus any laser light that does not interact with the activator in the crystal on the first pass of the LED light through the crystal.

Figure 5:
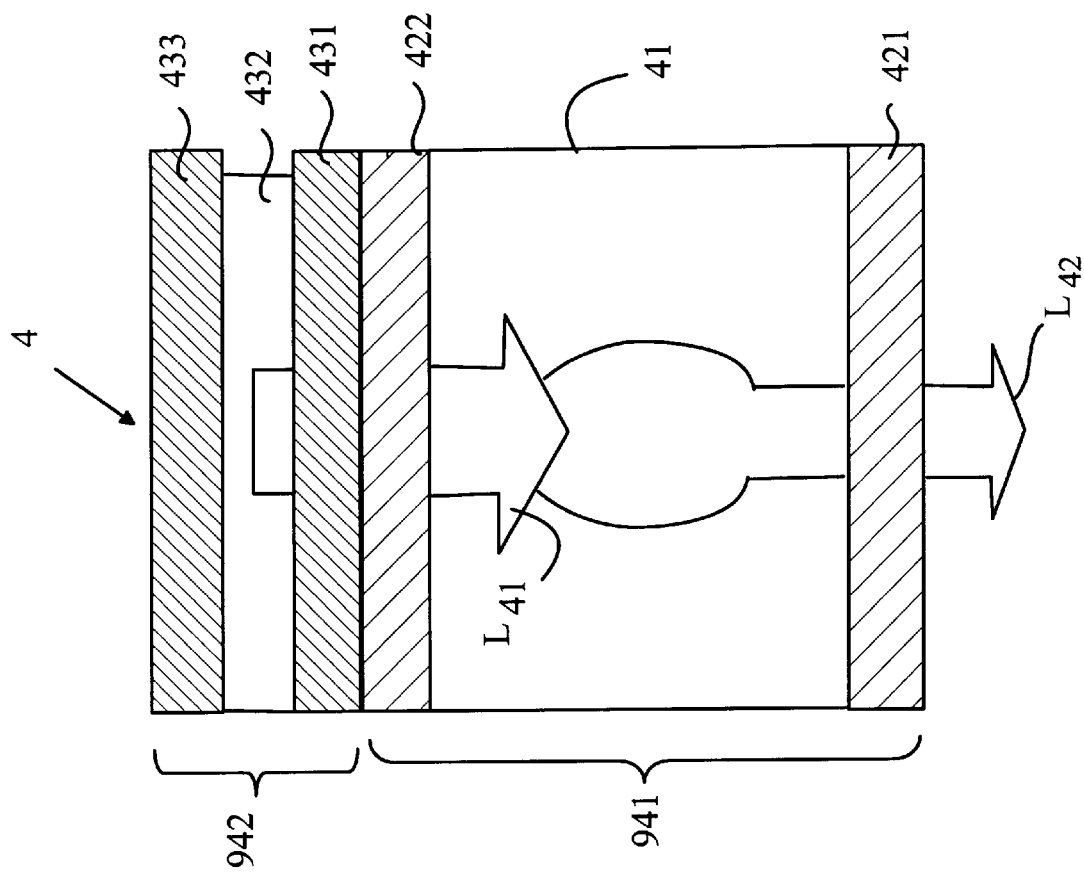
FIG. 5 is a cross-sectional view of a light source according to the present invention constructed from a solid-state laser and a laser diode.

As noted above, the LED emitters used to pump the solid-state laser may be replaced by a solid-state laser. Such an embodiment of the present invention is shown in FIG. 5 at 4. FIG. 5 is a cross-sectional view of a light source 4 constructed from a solid-state laser 941 and a laser emitter 942. Preferably the laser emitter 942 is a vertical-cavity surface-emitting laser.

Solid-state laser 941 is formed from an $Al_2O_3$ optical crystal substrate 41. An input mirror 422 and an output mirror 421 are formed on the top and bottom surfaces of substrate 41. In this embodiment, the solid-state laser 941 is a titanium sapphire laser, i.e., the $Al_2O_3$ optical crystal substrate 41 is doped with $Ti^{3+}$ to a concentration in the range from $10^{17}$ to $10^{21}$ cm$^{-3}$.

Optical crystal substrate 41 functions as the laser crystal of the solid-state laser and as a substrate for forming laser emitter 942. Laser emitter 942 is a light source formed on the input mirror 422 of laser 941 and consists of mirror 431, GaInN light-emitting layer 432, and mirror 433.

In this embodiment of the present invention, laser emitter 942 generates laser light $L_{41}$, with a 420-nm wavelength. This laser light pumps the solid-state lagser 941 to excite the activator $Ti^{3+}$. $Ti^{3+}$ has an absorption peak near 500 nm and a fluorescent peak centered near the 750-nm. Hence, when $Ti^{3+}$ is excited, laser light $L_{42}$ with an 800-nm wavelength is output from the output mirror 421.

The laser oscillation threshold $P_{th}$, of solid-state laser 941 can be shown to be approximately 10.3 MW/cm$^2$. Currently, a semiconductor laser such as the laser emitter 942 can provide a 200-mW output at the laser oscillation wavelength of 416 nm which corresponds to an energy density of 3.3 MW/cm$^2$. Hence, if the reflectivity of the mirrors is sufficient to provide at least 3 to 4 passes of the pumping light through the optical crystal, the required threshold power is easily obtained.

Figure 6:
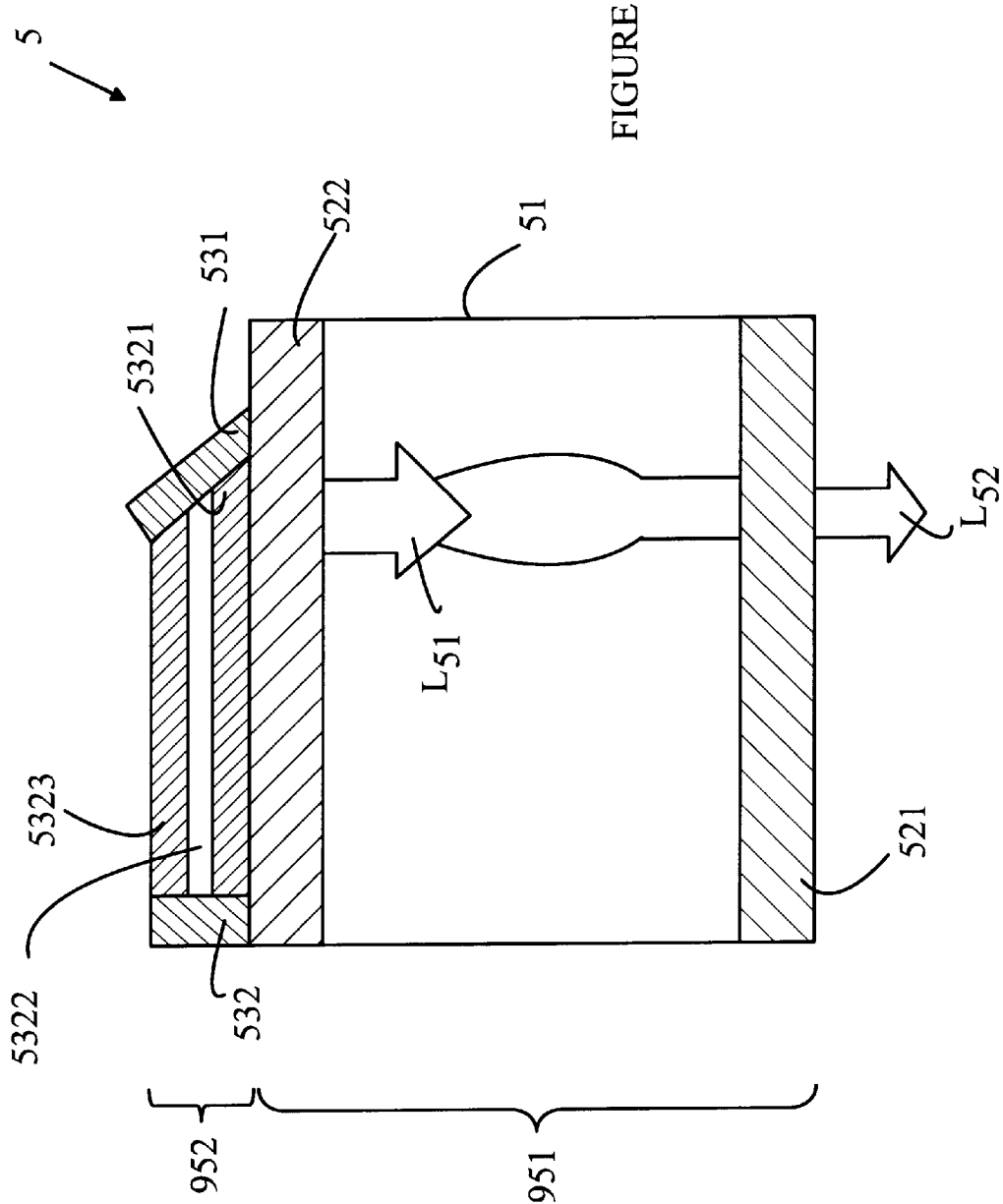
FIG. 6 is a cross-sectional view of another embodiment of a light source according to the present invention.

The power available for pumping the solid-state laser may be increased by lengthening the active layer of the pumping laser. Such an embodiment of the present invention is shown in FIG. 6 which is a cross-sectional view of another embodiment of a light source according to the present invention. Device 5 includes a solid-state laser 951 and a laser emitter 952. Preferably, the laser emitter 952 is a vertical-cavity surface-emitting laser.

Solid-state laser 951 has the same structure as solid-state laser 941 shown in FIG. 5. Solid-state laser 951 is formed from an $Al_2O_3$ optical crystal substrate 51 with an input mirror 522 and an output mirror 521 formed on the top and bottom surfaces of substrate 51. In this embodiment, solid-state laser 951 is a titanium sapphire laser, i.e., substrate 51 is doped with $Ti^{3+}$ at a concentration in the range from $10^{17}$ to $10^{21}$ cm$^{-3}$. Optical crystal substrate 51 functions as the laser crystal of the solid-state laser and as the substrate for forming laser emitter 952.

Laser emitter 952 is formed on mirror 522 of optical crystal substrate 51 and includes mirror 531, a GaInN light-emitting layer 5322, and mirror 532. The mirror 531 is formed at an incline at an angle of about 45° so as to deflect light into optical crystal 51. The GaInN light-emitting layer 5322 is formed between the mirrors 531 and 532. An n-cladding layer 5321 and a p-cladding layer 5323 provide the light guide for the laser emitter.

Laser emitter 952 generates light $L_{51}$ with a 420-nm wavelength. This light excites the $Al_2O_3$ laser crystal and the activator $Ti^{3+}$ to generate laser light $L_{52}$ with an 800-nm wavelength from the mirror 521.

Figure 7:
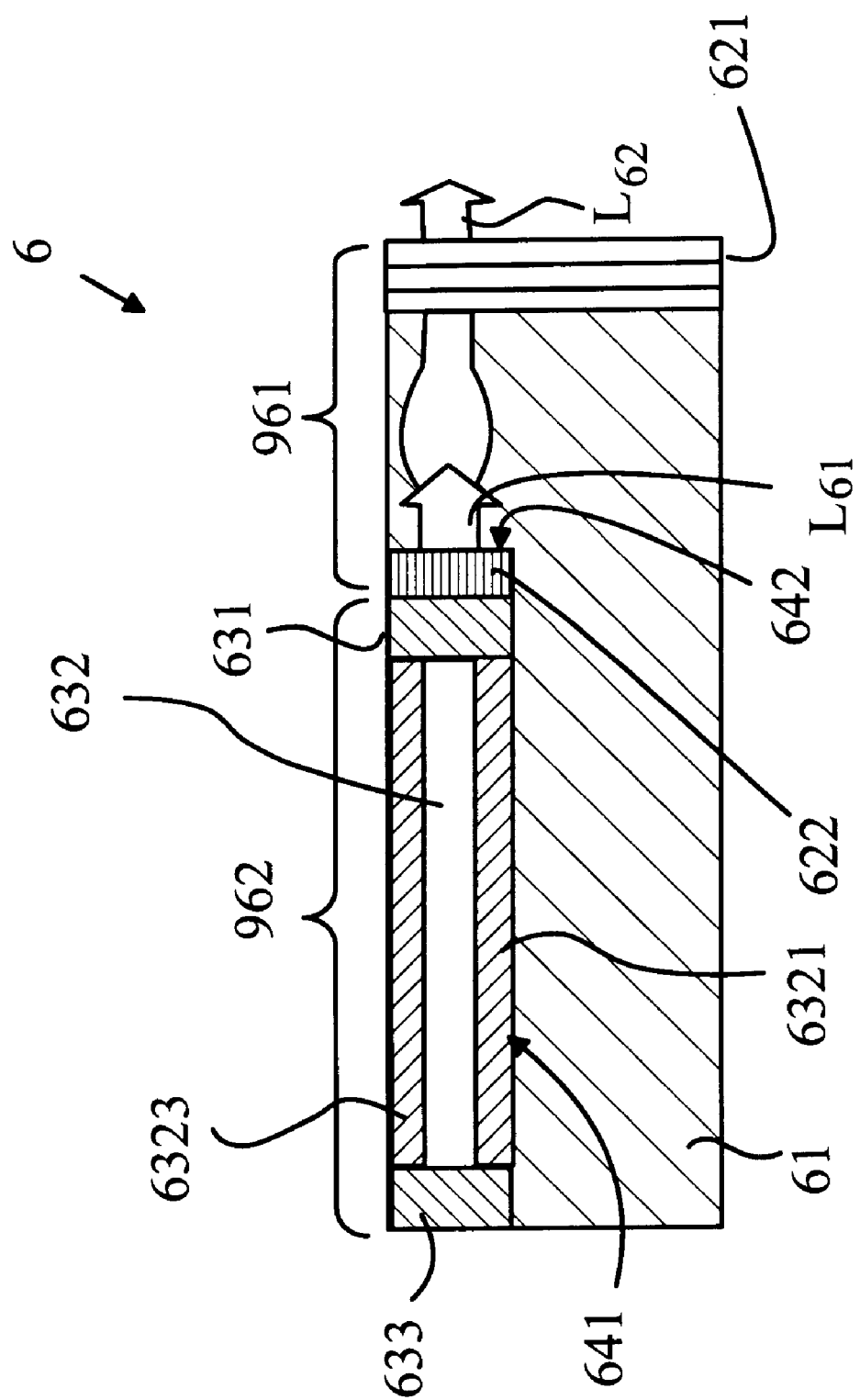
FIG. 7 is a cross-sectional view of another embodiment of an edge-emitting light source according to the present invention in which the light emitter is a laser diode.

The teachings of the present invention may also be utilized to construct an edge-emitting laser device. Refer now to FIG. 7, which is a cross-sectional view of an edge-emitting light source 6 according to the present invention. Device 6 includes a solid-state laser 961 and a laser emitter 962. Preferably, the laser emitter 962 is a vertical-cavity surface-emitting laser.

The solid-state laser 961 is formed from the top side of the $Al_2O_3$ optical crystal substrate 61, an output mirror 621, and an input mirror 622. Device 6 is constructed by etching a groove on the top surface of the optical crystal substrate 61. This groove has a horizontal bottom surface 641 and a wall surface 642 rising perpendicular from this bottom surface 641. Mirror 622 is formed on the wall surface 642. Mirror 621 is formed parallel to the mirror 622 on the end surface of the optical crystal substrate 61. The $Al_2O_3$ crystal between mirror 621 and mirror 622 functions as the laser crystal of the solid-state laser. In this embodiment of the present invention, the crystal is doped with $Ti^{3+}$ to a concentration in the range from $10^{17}$ to $10^{21}$ cm$^{-3}$.

The laser emitter 962 is formed in the groove. The $Al_2O_3$ optical crystal substrate 61 also functions as the substrate for forming laser emitter 962. Laser emitter 962 comprises mirror 631, GaInN light-emitting layer 632, and mirror 633. Mirror 631 is formed adjacent to mirror 622 and opposite mirror 633. An n-cladding layer 6321 and a p-cladding layer 6323 provide the light guide for laser emitter 962.

In the solid-state laser device 6, the laser emitter 962 generates laser light $L_{61}$ with a 420-nm wavelength. This laser light excites the activator $Ti^{3+}$ in the laser crystal ($Al_2O_3$), laser light $L_{62}$ with an 800-nm wavelength is output from mirror 621.

Figure 8:
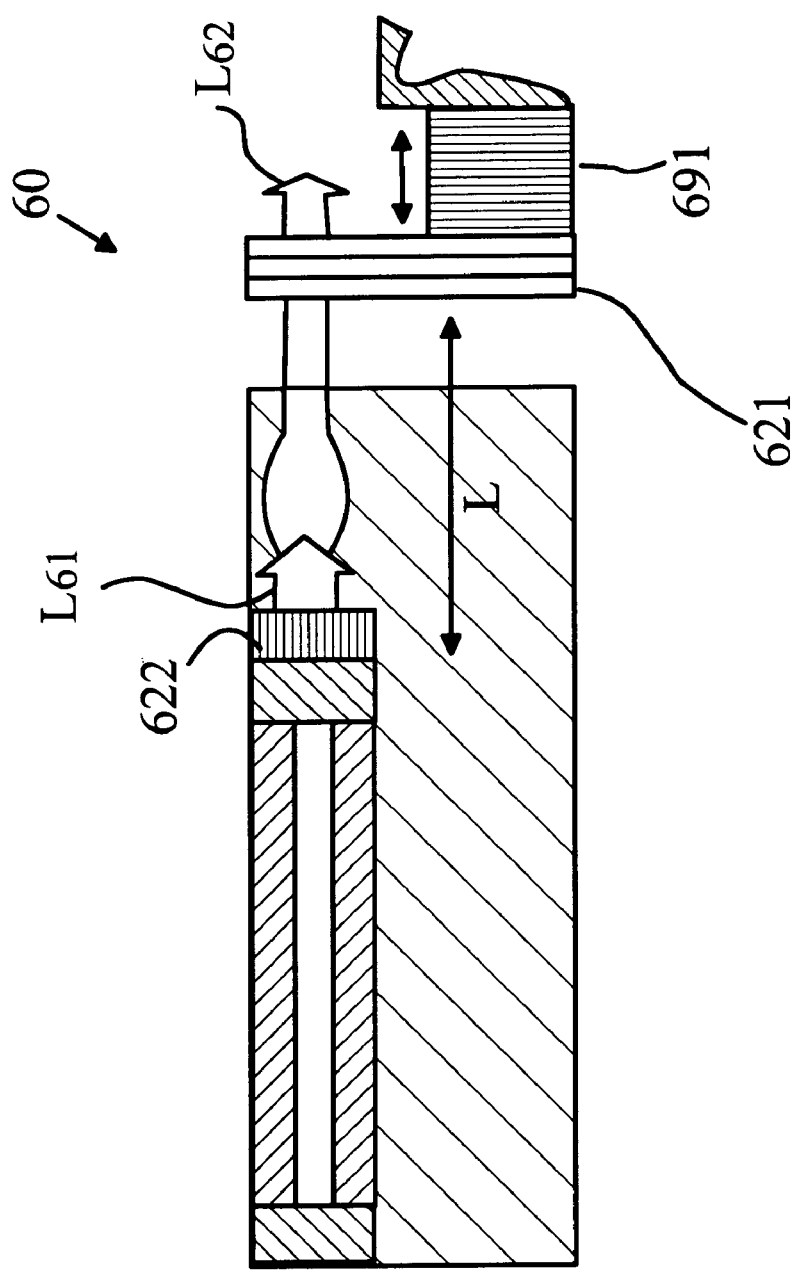
FIG. 8 is a cross-sectional view of another embodiment of an edge-emitting light source according to the present invention in which the light emitter is a laser diode.

The exact wavelength of the light laser light emitted by device 6 depends on the distance between mirrors 621 and 622. This distance can be varied with the aid of an actuator as illustrated in FIG. 8 which is a cross-sectional view of another embodiment of a light source according to the present invention. Source 60 differs from source 6 shown in FIG. 7 in that mirror 621 is mounted on an actuator 691 which varies the distance, L, between mirrors 622 and 621, and hence, the wavelength of laser light $L_{62}$. The actuator is preferably a piezoelectric element that responds to a signal that sets the exact distance, and hence, output wavelength.

Figure 9:
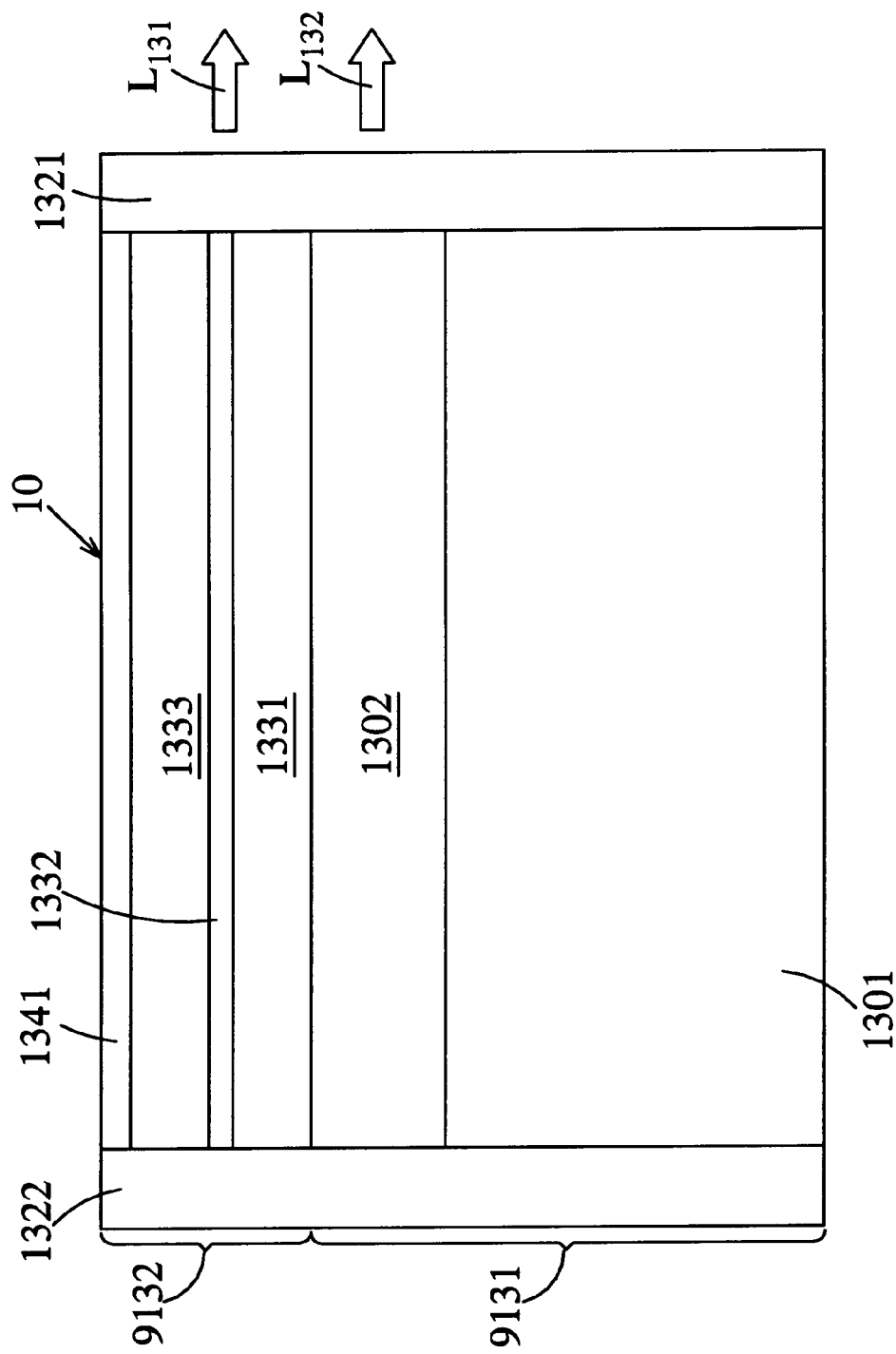
FIG. 9 is a cross-sectional view of another embodiment of a light source according to the present invention that is configured to emit light at two different wavelengths.

FIG. 9 is a cross-sectional view of another embodiment of an edge-emitting light source 10 according to the invention. Light source 10 includes a solid-state laser 9131 and a laser emitter 9132.

The solid-state laser 9131 is based on an $Al_2O_3$ optical crystal substrate 1301. In this embodiment, the solid-state laser 9131 is a ruby laser. $Cr^{3+}$ is doped with a concentration in the range from $10^{17}$ to $10^{21}$ cm$^{-3}$ in the portion 1302 of the optical crystal substrate 1301. FIG. 9 shows the doped portion 1302 occupying a fraction of the thickness of the optical crystal substrate 1301. In some embodiments, the doped portion may extend through the entire thickness of the optical crystal substrate. The doped portion of optical crystal substrate acts as the laser crystal of the solid-state laser, as described above. In addition, substrate 1301 provides the substrate on which the LED emitter 9132 is formed.

Laser emitter 9132 is formed on the optical crystal substrate 1301 and includes AlGaN cladding layer 1331, GaInN light-emitting layer 1332, and AlGaN cladding layer 1333. Light-emitting layer 1332, cladding layer 1333, and electrode 1341 are formed over one region of cladding layer 1331. Light is generated in LED 9132 by passing a current between electrode 1341 located on the cladding layer 1333 and another electrode (not shown) located on the cladding layer 1331 in a position similar to that of the second electrode 142 on the cladding layer 131 shown in FIG. 2.

Mirrors 1321 and 1322 are composed of multiple dielectric layers and are common to solid-state laser 9131 and laser emitter 9132. The mirrors are located on the end faces of these lasers.

For the dopants and crystal composition described above, laser emitter 9132 generates light at a wavelength of 420 nm in the light-emitting layer 1332. A fraction of the light generated by the laser emitter is emitted through output mirror 1321 as the light $L_{131}$. Another fraction of the light generated by the laser emitter is transmitted to the laser 9132 through the cladding layer 1331, which acts as an optical coupling guide layer. The light received from the laser emitter 9132 pumps solid-state laser 9131 to excite the activator $Cr^{3+}$ in the doped region 1302 of the $Al_2O_3$ laser crystal 1301. $Cr^{3+}$ has an absorption peak near the 400-nm wavelength and has a fluorescent peak near the 690-nm wavelength. Hence, the solid-state laser 9131 best generates light at a wavelength of 690 nm. The solid-state laser emits a fraction of this light through output mirror 1321 as the light $L_{132}$.

Light source 10 emits light $L_{131}$, and light $L_{132}$ at different wavelengths and in parallel beans that are spatially separated from one another. These parallel, spatially-separated light beams can easily be manipulated to combine them or to use them independently, depending on the application. The light source 10 is especially suited for a nitride semiconductor laser system having a thin cladding layer.

The above-described embodiments of the present invention have utilized a light source composed of the III–V nitride semiconductor formed on an $Al_2O_3$ crystal substrate doped with $Cr^{3+}$ or $Ti^{3+}$. However, other materials can be utilized. For example, the optical crystal substrate can be constructed from $BeAl_2O_4$ doped with $Cr^{3+}$ as the activator. This provides an absorption spectrum in the 500 to 700 nm range and a fluorescent spectrum in the 700 to 830 nm range. $BeAl_2O_4$ doped with $Ti^{3+}$ as the activator (chrysoberyl titanate) provides a 400 to 650 nm absorption band and a 730 to 950 nm fluorescent band. $MgF_2$ doped with $V^{2+}$ as the activator provides a 800 to 1,000 nm absorption band and a 1,050 to 1,300 nm fluorescent band.

As described above, when the light source is based on a group III–V semiconductor, GaAs, InP, GaP, or Si can be used as an optical crystal. The optical crystal substrate can be doped with rare earth ions. For example, when a GaAs crystal is doped with $Er^{3+}$ the crystal has absorption bands at 980, 807, and 655 nm and has fluorescent states at 1,535 and 1,522 nm. Since light absorption becomes larger for wavelengths shorter than 830 nm, GaAs must absorb the long wavelength, specifically, at 980 nm. Therefore, the laser emitter consists of an InGaAs layer, which is a light-emitting layer that emits light at 980 nm, and an AlGaAs layer as the cladding layer.

Figure 10:
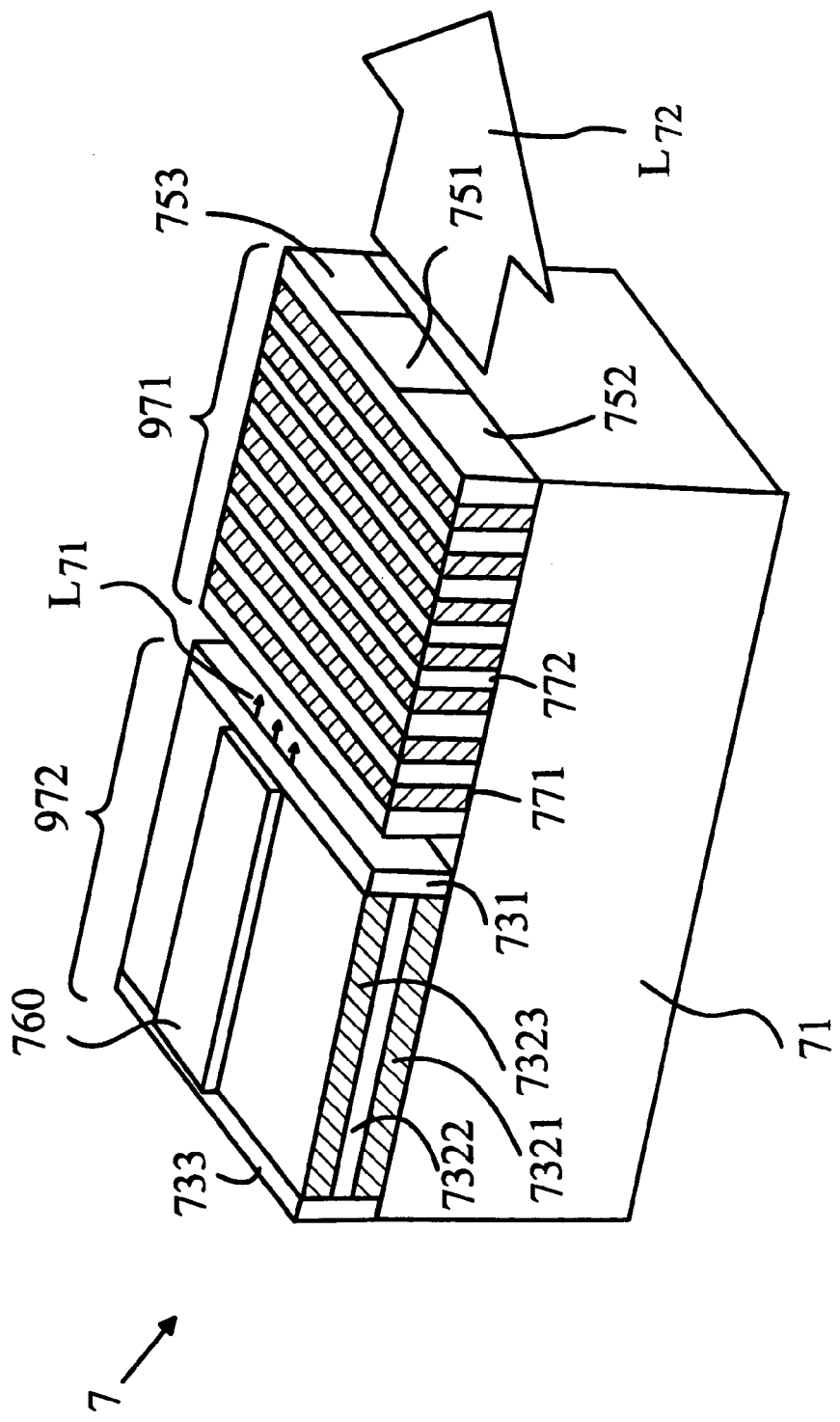
FIG. 10 is a perspective view of a light source according to the present invention for generating second harmonic light.

The teachings of the present invention may also be utilized to construct a device that generates second harmonic light. Refer now to FIG. 10, which is a perspective view of an edge-emitting light source 7 for generating second harmonic light. Source 7 includes a laser wavelength conversion section 971 and a laser emitter 972.

Laser conversion section 971 is formed on the top side of the $Sr_2Be_2BO_7$ optical crystal substrate 71. Laser conversion section 971 is formed so that a region 751 having a high refractive index is sandwiched by regions 752, 753 having a low refractive index. These regions become the waveguides for laser light $L_{71}$ that is generated by laser light emitter 972. Laser conversion section 971 has alternate polarized regions formed perpendicular to the waveguide direction. Exemplary polarized regions are shown at 771 and 772. These polarized regions have mutually reversed polarization directions and are polarized to be perpendicular to the waveguide direction.

Laser light emitter 972 is formed in a groove in a manner analogous to that described above with reference to the embodiment of the present invention shown in FIG. 7. Laser light emitter 972 includes mirror 731, mirror 733, n-cladding layer 7321, activation layer 7322, and p-cladding layer 7323.

Laser light emitter 972 generates laser light $L_{71}$ with a 420-nm wavelength. As this laser light $L_{71}$, passes through the laser conversion section 971, laser light $L_{72}$ with a 210-nm wavelength is output from the end surface of the optical crystal substrate 71 of laser conversion section 971.

The light-emitting device of the present invention can be constructed by using a well-known, conventional LED fabrication process or semiconductor laser fabrication process. Specifically, an engineer familiar with conventional LED or semiconductor laser fabrication techniques can fabricate the solid-state laser device described in each embodiment described above based on the description in this specification.

The manner in which the laser device shown in FIG. 6 is fabricated will now be described with reference to FIGS. 11A–11E, which are cross-sectional views of a light source 8 according to the present invention at various stages in the fabrication process. First, the n-AlGaN cladding layer 812, InGaAs emitting layer 813, and p-AlGaN cladding layer 814 are formed successively on the $Al_2O_3$ optical crystal substrate 811, as shown in FIG. 11A.

Figure 11:
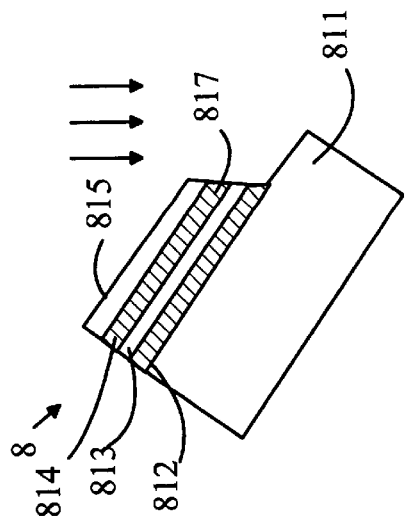
FIGS. 11A–11E a are cross-sectional view s of a light source according to one embodiment of the present invention at various stages in the fabrication process.
Figure 11:
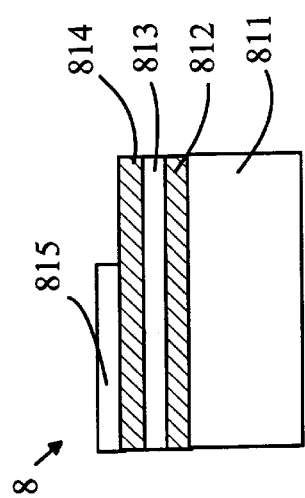
Figure 11:
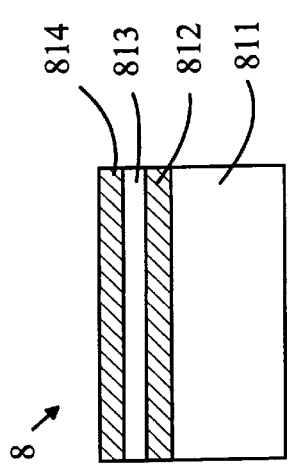
Figure 11:
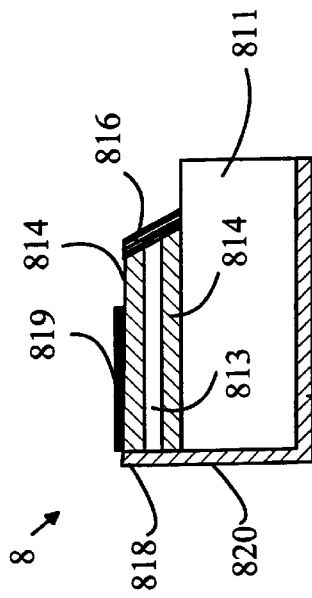
Figure 11:
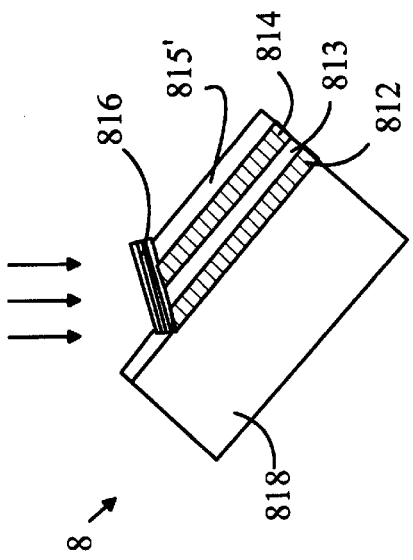

Next, an etching mask 815 is formed on a section of cladding layer 814 as shown in FIG. 11B. By using an etching technique capable of anisotropic etching, such as ion beam assist etching, cladding layer 812, emitting layer 813, and cladding layer 814 are etched from the inclined direction to form the inclined surface 817 shown in FIG. 11C.

Next, the etching mask 815 is removed, and a vapor deposition mask 815' is formed on all portions other than the inclined surface 817. Mirror 816 is then deposited on inclined surface 817 as shown in FIG. 11D.

Referring to FIG. 11E, electrode 819 is formed on the top surface of the cladding layer 814. Mirror 820 is then formed on the deposition end 818 of the optical crystal substrate 811, cladding layer 812, emitting layer 813, and cladding layer 814. Finally, output mirror 821 is formed on the bottom of the optical crystal substrate 811.

The structure of the source shown in FIG. 11E differs slightly from the structure of source 5 shown in FIG. 6. In FIG. 11E, the cladding layer 812 also functions as output mirror 531 shown in FIG. 6. However, source 8 operates in the same manner as source 5 described above.

The manner in which a structure such as that shown for the solid-state laser device described in FIG. 7 is constructed will now be described with reference to FIGS. 12A–12E, which are cross-sectional views of a light source 9 according to the present invention at various stages in the fabrication process. First, an etching mask 832 is formed on a section of the surface of the $Al_2O_3$ optical crystal substrate 831 as shown in FIG. 12A and a groove is formed as shown in FIG. 12B. Next, the n-AlGaN cladding layer 833, InGaN emitting layer 834, and p-AlGaN cladding layer 835 are formed successively as shown in FIG. 12C.

An etching mask 836 is then formed in the section corresponding to the bottom surface of the groove of the cladding layer and a space 838 is etched between the groove and the wall surface as shown in FIG. 12D. The etching is preferably performed by reactive ion etching which leaves both sides of the deposition layer section of the cladding layer 833, the emitting layer 834 and cladding layer 835 smooth. These smooth surfaces become the mirrors 841 and 840.

Next, etching mask 836 is removed, and a new etching mask 837 is formed to etch optical crystal substrate 831. A plurality of band-shaped unmasked areas are formed parallel to the wall surface of the groove as shown at 839 in FIG. 12D. The width of an unmasked area and the width of the masked area are set to a size equal to one-fourth the output wavelength of the solid-state laser. The optical crystal substrate 831 is etched in this state to form the mirror 843 consisting of a plurality of deep, fine grooves as shown in FIG. 12E.

Next, etching mask 837 is removed. Electrode 844 is then formed on cladding layer 835, and mirror 842 is formed on the end surface of optical crystal substrate 831. The various mirrors, with the exception of mirror 843, are preferably formed by vapor deposition. It should be noted that mirror 843 is transparent at the wavelength of the excitation light but reflects at the wavelength of the output laser light.

Figure 13:
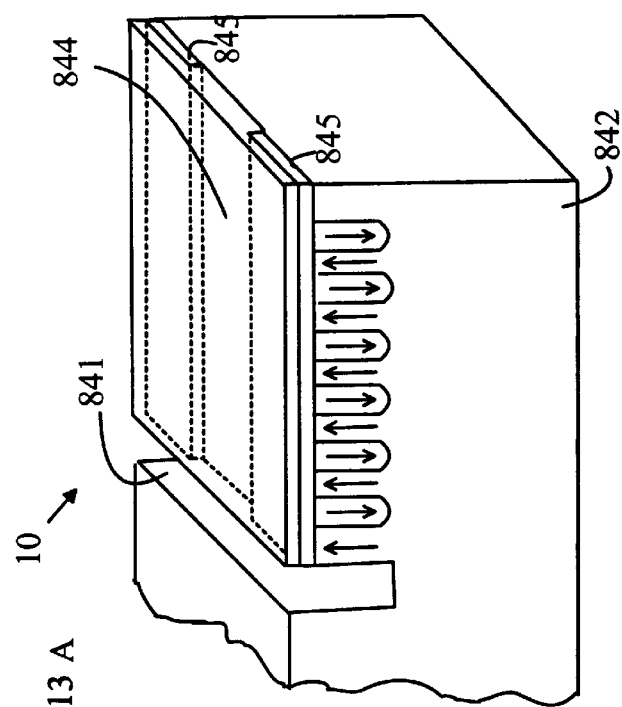
FIGS. 13A–13C are perspective views of a light source according to a third embodiment of the present invention at various stages in the fabrication process.
Figure 13:
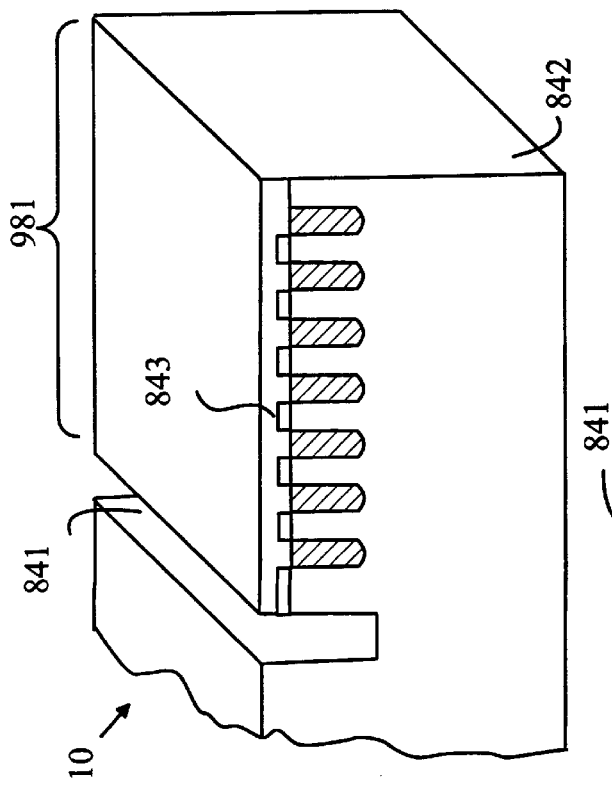
Figure 13:
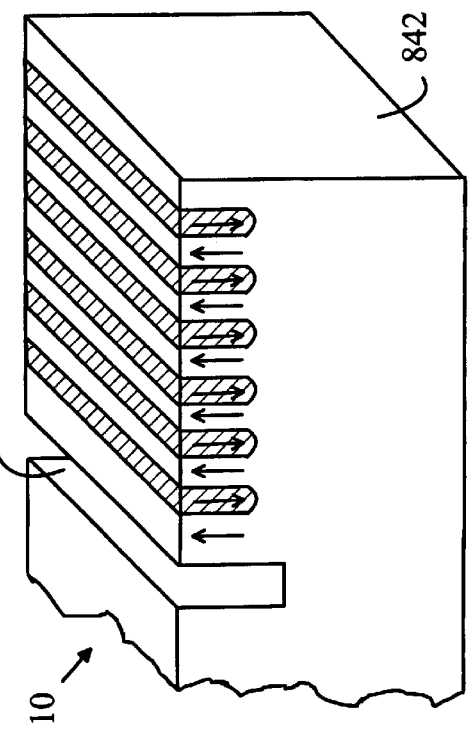

The manner in which a laser device for generating second harmonic light, such as the device shown in FIG. 10, is constructed will now be explained with reference to FIGS. 13A–13C, which are cross-sectional views of a portion of a light source 10 according to the present invention. The description of the method for forming the laser light emitter is substantially the same as that described above with reference to FIGS. 11A–11E, and hence, this detail has been omitted.

In forming the light conversion section 981, a periodic pattern 843 of $SiO_2$ is formed parallel to the wall surface of the groove on the optical crystal substrate 842. The period is determined based on the refractive index at the fundamental wavelength (laser) and the wavelength of the second harmonic light, and has about a 1 $\mu$m period. Next, the dopant is vapor deposited as shown in FIG. 13A and heat treated at temperature $T_1$. The polarization of the doping region is the opposite of that in the optical crystal substrate as indicated in FIG. 13B.

Next, a pattern 845 of $SiO_2$ is formed perpendicular to the wall surface of the groove. A dopant is vapor deposited and heat treated to a temperature $T_2$ to form the waveguide 844 as shown in FIG. 13C. The heat treatment temperature $T_2$ is lower than temperature $T_1$, described above.

The light source according to the invention may be configured to emit light at more than one wavelength, as described above with reference to FIG. 9. The embodiments of the light source according to the invention not shown as emitting a fraction of the pumping light may also be configured to emit a fraction of the pumping light generated by the LED or laser emitter in addition to the light generated by the solid-state laser or light conversion device. In some applications, such as an interferometer, the light source according to the invention can be configured to emit a fraction of the pumping light generated by the laser emitter, and the light conversion device can be configured to generate light at a wavelength corresponding to the second harmonic of the pumping light. The light at the two, harmonically-related wavelengths can then be used for the heterodyne operation of the interferometer. The light source can be configured to emit a fraction of the pumping light by making the reflectivity of the output mirror less than 100% at the wavelength of the pumping light.

In other applications, embodiments of the light source according to the invention can be configured to emit light at more than two wavelengths. The wavelengths may or may not include the wavelength of the pumping light. For example, the light source can generate light at multiple wavelengths that is then mixed together to provide light of a desired color. Alternatively, the light at the different wavelengths may be used independently. Embodiments of the light source is configured to emit light at more than two wavelengths by configuring the mirrors of the solid-state laser to have a reflectivity peak at each of the desired emission wavelengths. Such embodiments of the light source can be configured additionally to emit a fraction of the pumping light by making the reflectivity of the output mirror less than 100% at the wavelength of the pumping light.

Moreover, embodiments of the light source can be configured to emit a fraction of the pumping light independently of the laser output to enable the operation of the LED emitter or laser emitter that generates the pumping light to be monitored, or for other purposes.

Various modifications to the invention will become apparent to those skilled in the art from the foregoing description and accompanying drawings. Accordingly, the invention is to be limited solely by the scope of the following claims.

What is claimed is:

1. A light source comprising:
    a light emitting device comprising a semiconductor device on a surface of a substrate, said light emitting device emitting light of a first wavelength; and
    a light conversion device comprising a portion of said substrate, said light conversion device receiving said light of said first wavelength and emitting light of a second wavelength different from said first wavelength wherein said light emitting device comprises a mirror for reflecting light that is not converted to said second wavelength by said light conversion device back into said light conversion device.

2. The light source of claim 1 wherein said substrate comprises a crystal of a fluorescent material doped with an activator.

3. The light source of claim 2 wherein said substrate comprises a compound chosen from the group consisting of $Al_2O_3$, $BeAl_2O_4$, $Sr_2Be_2BO_7$, $KTiOPO_4$, $LiB_3O_5$, $BaB_2O_4$, $NH_4H_2PO_4$, $LiTaO_3$, GaAs, InP, GaP, and Si.

4. The light source of claim 3 wherein said activator is a rare earth ion.

5. The light source of claim 4 wherein said rare earth ion is chosen from the group consisting of $Cr^{3+}$, $Ti^{3+}$, $Er^{3+}$, $V^{2+}$, $Co^{2+}$, and $Nd^{3+}$.

6. The light source of claim 2 wherein said activator is excited by a harmonic of said light generated by said light emitting device.

7. The light source of claim 1 wherein said light emitting device comprises a light emitting diode.

8. The light source of claim 1 wherein said light-emitting device comprises a laser diode.

9. The light source of claim 1 wherein said light-emitting device comprises a III–V semiconductor.

10. The light source of claim 1 wherein said light conversion device comprises a solid state laser having an activation wavelength equal to said first wavelength.

11. The light source of claim 1 wherein said substrate further comprises a waveguide comprising a region of a first refractive index sandwiched between regions of a second refractive index, said second refractive index being less than said first refractive index, said waveguide defining a light propagation direction.

12. The light source of claim 11 wherein said substrate further comprises alternate polarized regions formed perpendicular to said light propagation direction.

13. The light source of claim 1 wherein said substrate comprises a groove in which said light-emitting device is located, said light-emitting device emitting light into a wall of said groove.

14. The light source of claim 1 wherein said light-emitting device comprises a mirror for reflecting light generated therein into said substrate.

15. The light source of claim 1 wherein said light conversion device additionally emits light of said first wavelength.

16. The light source of claim 1 wherein said light conversion device additionally emits light of a third wavelength, different from said first wavelength and said second wavelength.

17. The light source of claim 16 wherein said light conversion device additionally emits light of said first wavelength.

* * * * *